(12) United States Patent
Yoshitsugu et al.

(10) Patent No.: US 11,482,464 B2
(45) Date of Patent: Oct. 25, 2022

(54) SEMICONDUCTOR DEVICE INCLUDING A DIAMOND SUBSTRATE AND METHOD OF MANUFACTURING THE SEMICONDUCTOR DEVICE

(71) Applicant: Mitsubishi Electric Corporation, Tokyo (JP)

(72) Inventors: Koji Yoshitsugu, Tokyo (JP); Keisuke Nakamura, Tokyo (JP); Eiji Yagyu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 141 days.

(21) Appl. No.: 16/978,191

(22) PCT Filed: Jun. 28, 2018

(86) PCT No.: PCT/JP2018/024584
§ 371 (c)(1),
(2) Date: Sep. 4, 2020

(87) PCT Pub. No.: WO2020/003436
PCT Pub. Date: Jan. 2, 2020

(65) Prior Publication Data
US 2021/0043539 A1 Feb. 11, 2021

(51) Int. Cl.
*H01L 23/373* (2006.01)
*H01L 21/02* (2006.01)
(Continued)

(52) U.S. Cl.
CPC ...... *H01L 23/3732* (2013.01); *H01L 21/0254* (2013.01); *H01L 21/02381* (2013.01);
(Continued)

(58) Field of Classification Search
None
See application file for complete search history.

(56) References Cited

U.S. PATENT DOCUMENTS 6,956,250 B2  10/2005 Borges et al.
7,846,767 B1  12/2010 Sung
(Continued)

FOREIGN PATENT DOCUMENTS

JP  11-283994 A  10/1999
JP  2007-096130 A  4/2007
(Continued)

OTHER PUBLICATIONS

International Search Report and Written Opinion dated Jul. 31, 2018 for PCT/JP2018/024584 filed on Jun. 28, 2018, 9 pages including English Translation of the International Search Report.
(Continued)

*Primary Examiner* — Scott B Geyer
(74) *Attorney, Agent, or Firm* — Xsensus LLP

(57) ABSTRACT

A semiconductor device includes a diamond substrate made of diamond, and a nitride semiconductor layer formed in a recess formed at an upper surface of the diamond substrate. The semiconductor device further includes at least one of: (A) the nitride semiconductor layer formed to be surrounded entirely by the upper surface of the diamond substrate in a plan view; (B) the diamond substrate in which the upper surface of the diamond substrate and an upper surface of the nitride semiconductor layer are located on the same plane; and (C) the diamond substrate having electrical insulating properties.

6 Claims, 10 Drawing Sheets

(51) Int. Cl.
  *H01L 21/48*    (2006.01)
  *H01L 21/78*    (2006.01)
  *H01L 29/20*    (2006.01)
  *H01L 29/66*    (2006.01)
  *H01L 29/778*    (2006.01)
  *H01L 29/06*    (2006.01)

(52) U.S. Cl.
  CPC ...... *H01L 21/4803* (2013.01); *H01L 21/7806* (2013.01); *H01L 29/0657* (2013.01); *H01L 29/2003* (2013.01); *H01L 29/66462* (2013.01); *H01L 29/7786* (2013.01)

(56) References Cited

U.S. PATENT DOCUMENTS

| | | | |
|---|---|---|---|
| 8,575,657 | B2 | 11/2013 | Gambin et al. |
| 2007/0114539 | A1 | 5/2007 | Suzuki et al. |
| 2014/0110722 | A1* | 4/2014 | Kub ................ H01L 29/7787 257/77 |
| 2015/0056763 | A1* | 2/2015 | Hobart ............. H01L 23/367 438/172 |

FOREIGN PATENT DOCUMENTS

| | | | |
|---|---|---|---|
| JP | 4311939 | B2 | 8/2009 |
| JP | 6174113 | B2 | 8/2017 |
| WO | WO-2015171873 | A1 * | 11/2015 ....... H01L 21/02527 |

OTHER PUBLICATIONS

Jessen, G.H., et al., "AlGaN/GaN HEMT on Diamond Technology Demonstration," in Proceedings of CSICS, IEEE, TX, 2006, pp. 271-274.

Shon, J.W., et al., "Structural properties of GaN films grown on multilayer graphene films by pulsed sputtering," Applied Physics Express 7, 085502, Jul. 24, 2014, pp. 085502-1 to 085502-3.

Great Britain Office Action dated Dec. 29, 2021, in corresponding GB Patent Application No. GB2020038.2.

Examination Report dated Oct. 29, 2021, in corresponding Great Britain patent Application No. GB2020038.2, 5 pages.

* cited by examiner

F I G. 1
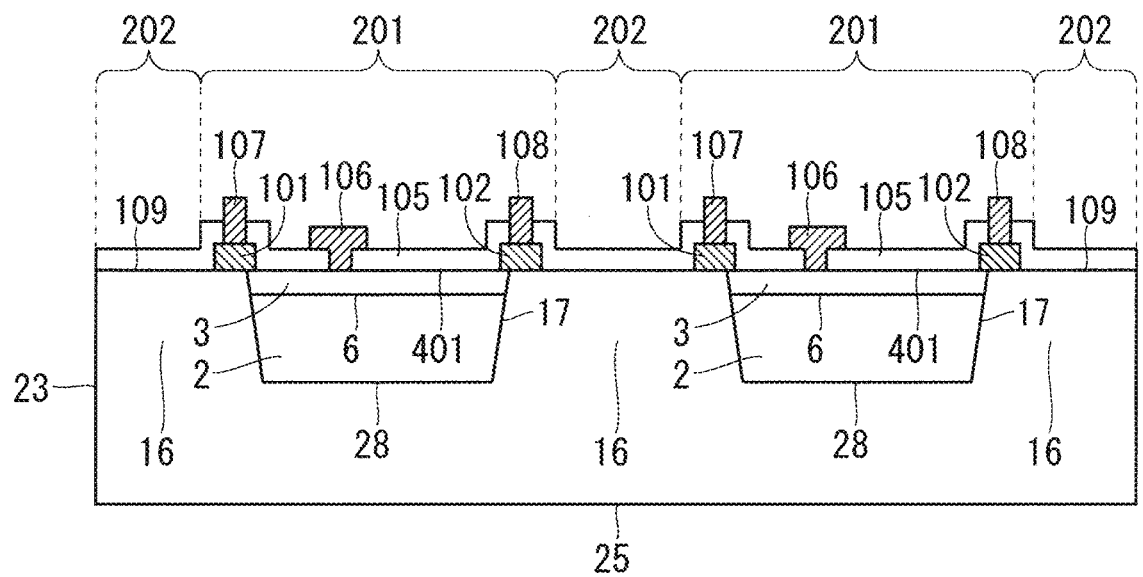
F I G. 2
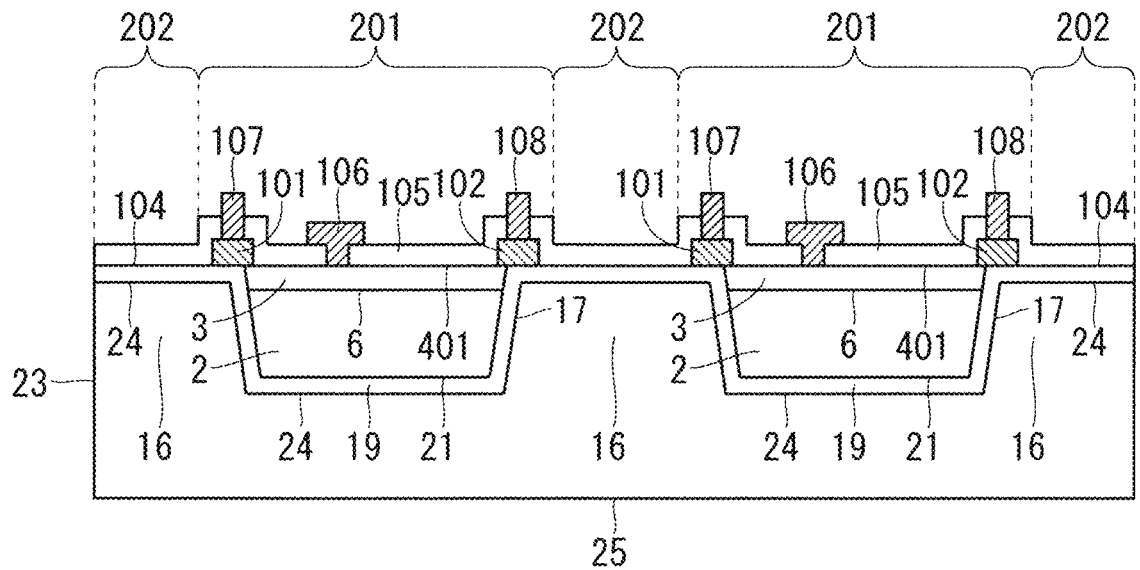

F I G. 8
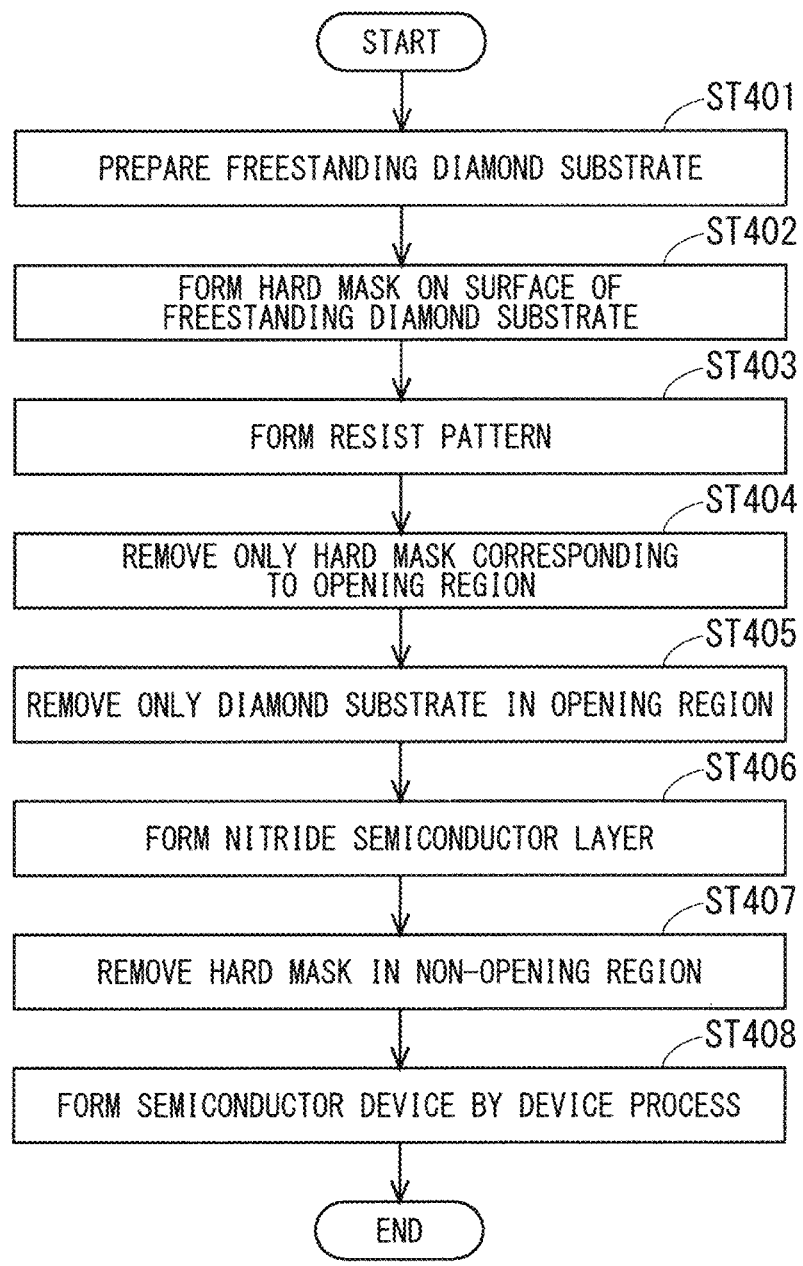

SEMICONDUCTOR DEVICE INCLUDING A DIAMOND SUBSTRATE AND METHOD OF MANUFACTURING THE SEMICONDUCTOR DEVICE

CROSS-REFERENCE TO RELATED APPLICATIONS

The present application is based on PCT filing PCT/JP2018/024584, filed Jun. 28, 2018, the entire contents of which are incorporated herein by reference.

TECHNICAL FIELD

A technique disclosed in this description relates to a semiconductor device and a method of manufacturing the semiconductor device.

BACKGROUND ART

For example, a field-effect transistor made of a nitride-based semiconductor has conventionally been used as a high-output semiconductor device to operate in a high-frequency region. However, temperature increase in the semiconductor device during high-output operation causes a problematic phenomenon of characteristic or reliability reduction of the device.

To suppress such temperature increase in the semiconductor device, it is important to provide a material of high heat dissipation performance or a structure of high heat dissipation performance near a part to generate heat. Diamond has the highest heat conductivity of those of solid substances and is used optimally as a material for heat dissipation.

In a conventional semiconductor device using a diamond substrate, diamond is provided at least partially inside a via formed in a part of a substrate of the semiconductor device. This allows heat generated in the semiconductor device to be dissipated in a thickness direction (see patent document 1, for example).

In a semiconductor device expected to achieve higher heat dissipation effect, a substrate of the semiconductor device is replaced entirely with diamond to allow heat generated in the semiconductor device to be dissipated efficiently and diffusedly (see non-patent document 1, for example).

PRIOR ART DOCUMENTS

Patent Documents

Patent Document 1: Japanese Patent Publication No. 6174113

Non-Patent Documents

Non-Patent Document 1: G. H. Jessen et al., "AlGan/GaN HEMT on Diamond Technology Demonstration," in proceedings of CSICS, IEEE, TX, pp. 271-274 (2006)

SUMMARY

Problem to be Solved by the Invention

To achieve maximum heat dissipation effect, it is required to provide a material for heat dissipation having high heat conductivity near a heat generation source to dissipate heat efficiently.

According to the conventional techniques, however, diamond as a material for heat dissipation is used only in a part of a via in a substrate or is used only in the substrate. Also, a main direction of the heat dissipation is limited to a thickness direction.

Limiting heat dissipation to the thickness direction causes a risk of failing to reduce temperature increase sufficiently occurring in an active region of a semiconductor device.

The technique disclosed in this description has been made to solve the foregoing problem, and is intended to provide a semiconductor device having high heat dissipation performance.

Means to Solve the Problem

A first aspect of the technique disclosed in this description includes a diamond substrate made of diamond, and a nitride semiconductor layer formed in a recess formed at the upper surface of the diamond substrate.

A second aspect of the technique disclosed in this description includes: forming a nitride semiconductor layer on the upper surface of a semiconductor substrate; joining a surface of the nitride semiconductor layer and a support substrate to each other; forming a hard mask on the lower surface of the semiconductor substrate; forming a pattern defining an opening region in the hard mask; forming a groove penetrating the semiconductor substrate and the nitride semiconductor layer by removing the semiconductor substrate and the nitride semiconductor layer corresponding to the opening region; removing the hard mask and the semiconductor substrate; forming a diamond layer covering the nitride semiconductor layer on a surface of the support substrate; and disengaging a surface of the nitride semiconductor layer and a surface of the diamond layer from the support substrate.

A third aspect of the technique disclosed in this description includes: preparing a diamond substrate made of diamond; forming a hard mask on a surface of the diamond substrate; forming a pattern defining an opening region in the hard mask; forming a recess by removing the diamond substrate corresponding to the opening region; and epitaxially growing a nitride semiconductor layer in the recess.

Effects of the Invention

The first aspect of the technique disclosed in this description includes a diamond substrate made of diamond, and a nitride semiconductor layer formed in a recess formed at the upper surface of the diamond substrate. In this configuration, diamond having high heat conductivity is formed to contact not only the lower surface but also the lateral surface of the nitride semiconductor layer. Thus, if the semiconductor device including the nitride semiconductor layer becomes a heat generation source as a result of the formation of an element structure on the upper surface of the nitride semiconductor layer, for example, high heat dissipation performance is provided in a lateral direction in addition to a downward direction of the semiconductor device. This makes it possible to suppress temperature increase in the semiconductor device significantly.

The second aspect of the technique disclosed in this description includes: forming a nitride semiconductor layer on the upper surface of a semiconductor substrate; joining a surface of the nitride semiconductor layer and a support substrate to each other; forming a hard mask on the lower surface of the semiconductor substrate; forming a pattern defining an opening region in the hard mask; forming a groove penetrating the semiconductor substrate and the nitride semiconductor layer by removing the semiconductor substrate and the nitride semiconductor layer corresponding to the opening region; removing the hard mask and the semiconductor substrate; forming a diamond layer covering the nitride semiconductor layer on a surface of the support substrate; and disengaging a surface of the nitride semiconductor layer and a surface of the diamond layer from the support substrate. In this configuration, before implementation of a step of removing the semiconductor substrate entirely, the groove is formed in advance to penetrate the semiconductor substrate and the nitride semiconductor layer. This makes it possible to reduce the occurrence of a crack or a fracture in the nitride semiconductor layer resulting from stress relief The third aspect of the technique disclosed in this description includes: preparing a diamond substrate made of diamond; forming a hard mask on a surface of the diamond substrate; forming a pattern defining an opening region in the hard mask; forming a recess by removing the diamond substrate corresponding to the opening region; and epitaxially growing a nitride semiconductor layer in the recess. This configuration makes it possible to manufacture the semiconductor device in a simple way.

These and other objects, features, aspects, and advantages relating to a technique disclosed in this description will become more apparent from the following detailed description when taken in conjunction with the accompanying drawings.

BRIEF DESCRIPTION OF DRAWINGS

FIG. 1 is a cross-sectional view schematically showing an example of the configuration of a semiconductor device relating to an embodiment;

FIG. 2 is a cross-sectional view schematically showing an example of the configuration of the semiconductor device relating to the embodiment;

FIG. 8 is a flowchart showing another example of a method of manufacturing the semiconductor device shown in the example of FIGS. 1 to 6;

DESCRIPTION OF EMBODIMENT(S)

Figure 3:
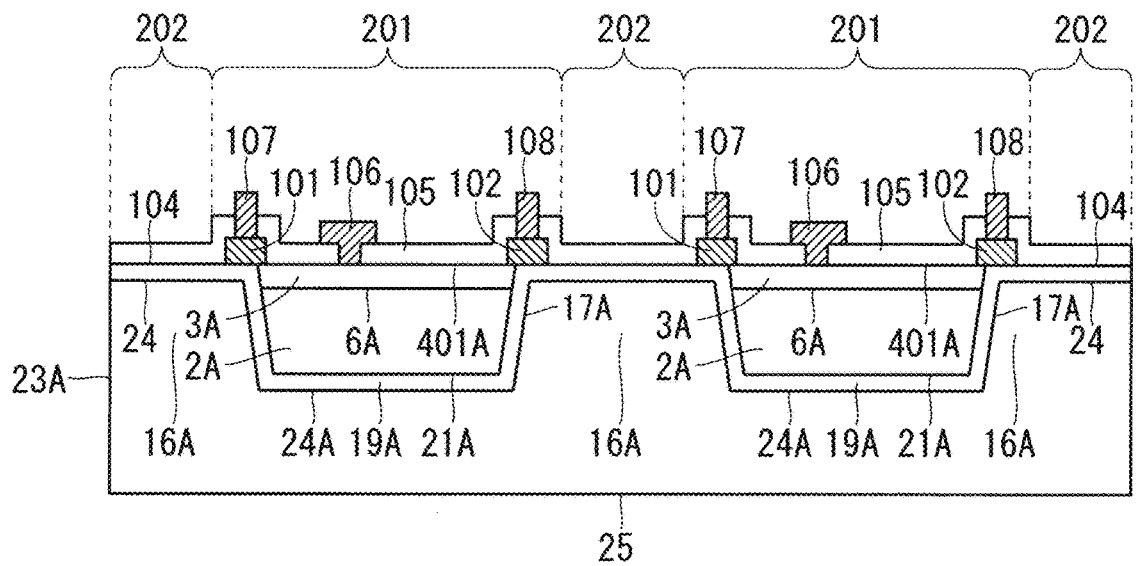
FIG. 3 is a cross-sectional view schematically showing another example of the configuration of the semiconductor device relating to the embodiment.

An embodiment will be described below by referring to the accompanying drawings.

The drawings are presented schematically. For the convenience of illustration, a structure is omitted or simplified, where appropriate. Correlations in terms of size and position between structures, etc. shown in different drawings are not always illustrated correctly but are changeable, where appropriate. In a drawing such as a plan view other than a cross-sectional view, hatches may be given to facilitate understanding of the substance of the embodiment.

In the description given below, similar components will be given the same sign and illustrated with the same sign in the drawings. These components will be given the same name and are to fulfill the same function. Thus, to avoid duplication, detailed description of these components will be omitted in some cases.

In the description given below, a term meaning a particular position or a particular direction such as "upper," "lower," "left," "right," "side," "bottom," "front," or "back" is used. These terms are used for the purpose of convenience to facilitate understanding of the substance of the embodiment, and do not relate to directions in actual use.

First Embodiment

A semiconductor device and a method of manufacturing the semiconductor device relating to the present embodiment will be described below.

<Configuration of Semiconductor Device>

FIG. 1 is a cross-sectional view schematically showing an example of the configuration of the semiconductor device relating to the present embodiment. As shown in the example of FIG. 1, the semiconductor device includes: a diamond substrate 23 made of diamond; an epitaxial semiconductor layer 2 as a nitride semiconductor layer formed in a recess 17 of the diamond substrate 23; an epitaxial semiconductor layer 3 formed on the upper surface of the epitaxial semiconductor layer 2; a source or drain electrode metal 101 formed partially on an upper surface 401 of the epitaxial semiconductor layer 3; a drain or source electrode metal 102 formed partially on the upper surface 401 of the epitaxial semiconductor layer 3; a gate electrode metal 106 formed partially on the upper surface 401 of the epitaxial semiconductor layer 3; a surface protective film 105 formed to partially cover an upper surface 109 of a projection 16 and the upper surface 401 of the epitaxial semiconductor layer 3; a source or drain pad electrode metal 107 formed to partially cover the upper surface of the source or drain electrode metal 101; and a drain or source pad electrode metal 108 formed to partially cover the upper surface of the drain or source electrode metal 102.

The diamond substrate 23 has the upper surface 109 and a lower surface 25. The projection 16 is formed at the upper surface 109 of the diamond substrate 23. The recess 17 surrounded on four sides by the projection 16 in a plan view is filled with the epitaxial semiconductor layer 2 and the epitaxial semiconductor layer 3 made of a GaN-based material or an AlN-based material (hereinafter called a nitride-based semiconductor material). The recess 17 is not always required to be surrounded by the projection 16 in a plan view. Namely, the recess 17 may have a stripe structure extending in the front-back direction of the plane of the sheet of the drawing (this also applies to embodiments described below).

Examples of the material of the epitaxial semiconductor layer 2 and the epitaxial semiconductor layer 3 include Si, GaAs, SiC, and $Ga_2O_3$.

While the epitaxial semiconductor layer 2 and the epitaxial semiconductor layer 3 are stacked in the present embodiment, a single epitaxial semiconductor layer may be formed in the recess 17.

A field-effect transistor 201 is formed on the upper surface 401 of the epitaxial semiconductor layer 3. The field-effect transistor mentioned herein is a metal-insulator-semiconductor (in short, MIS) field-effect transistor, a metal-oxide-semiconductor (in short, MOS) field-effect transistor, or a horizontal semiconductor device such as a high electron mobility transistor (in short, HEMT), for example. In the present embodiment, an HEMT device is shown as an example.

The upper surface 401 of the epitaxial semiconductor layer 3 is located on the same plane as the upper surface 109 of the diamond substrate 23.

The HEMT device formed on the upper surface 401 of the epitaxial semiconductor layer 3 includes the source or drain electrode metal 101, the drain or source electrode metal 102, and the gate electrode metal 106.

The HEMT device formed on the upper surface 401 of the epitaxial semiconductor layer 3 may include the source or drain pad electrode metal 107 and the drain or source pad electrode metal 108.

Any shape conforming to a purpose of the present embodiment is applicable to the shape of the gate electrode metal 106. A field plate electrode metal may be formed on the upper surface of the gate electrode metal 106.

In a region without an electrode, the surface protective film 105 is formed at least in one layer on the upper surface 401 of the epitaxial semiconductor layer 3. The surface protective film 105 functions to control an electric field or surface potential, to provide inactivation, water resistance, or moisture resistance of a surface level, etc. A part of the gate electrode metal 106 is not always required to be formed to cover a part of the surface protective film 105.

An element-to-element isolation region 202 is provided in a gap between adjacent field-effect transistors 201. The element-to-element isolation region 202 is formed on the projection 16 at the upper surface 109 of the diamond substrate 23.

In the foregoing configuration of the semiconductor device, the field-effect transistor 201 is surrounded on four sides in a plan view by the diamond substrate 23 as a high heat conductivity material.

Heat is generated in an active region in the field-effect transistor 201. For this reason, surrounding the active region on four sides in a plan view by the high heat conductivity material causes the semiconductor device relating to the present embodiment to achieve high heat dissipation efficiency. Additionally, the epitaxial semiconductor layer 2 and the diamond substrate 23 directly contact each other to form a joint interface 28, thereby reducing influence of interface thermal resistance. This allows dissipation of heat seamlessly (in a state without a seam).

Diamond is a material generally having high electrical insulating properties. Thus, if the diamond substrate 23 applied to the present embodiment has electric resistivity sufficiently higher at least than that of the epitaxial semiconductor layer 2 or that of the epitaxial semiconductor layer 3, the projection 16 of the diamond substrate 23 becomes capable of fulfilling the function of element-to-element isolation.

In a process of forming the HEMT device, an element-to-element isolation step is generally required, and this step is performed by a technique using dry etching process for physically eliminating two-dimensional electron gas to become carriers, or by a technique using selective ion implantation process for physically destroying epitaxial semiconductor crystal in a region corresponding to an element isolation region.

By contrast, in the configuration of the semiconductor device shown in the example of FIG. 1, the presence of the electrical insulating properties of crystal diamond allows simplification of the complicated element-to-element isolation step described above.

Second Embodiment

A semiconductor device and a method of manufacturing the semiconductor device relating to the present embodiment will be described below. In the description given below, a component similar to the component described in the foregoing embodiment will be given the same sign and illustrated with the same sign in the drawing. Detailed description of this component will be omitted, where appropriate.

<Configuration of Semiconductor Device>

In FIG. 1, the epitaxial semiconductor layer 2 and the diamond substrate 23 directly contact each other. In a configuration described in the present embodiment, the epitaxial semiconductor layer 2 and the diamond substrate 23 do not directly contact each other.

FIG. 2 is a cross-sectional view schematically showing an example of the configuration of the semiconductor device relating to the present embodiment. As shown in the example of FIG. 2, the semiconductor device includes: the diamond substrate 23; an adhesion layer or a core forming layer 19 formed to cover the projection 16 and the inner walls of the recess 17 of the diamond substrate 23; the epitaxial semiconductor layer 2 formed in the recess 17 of the diamond substrate 23 covered by the adhesion layer or core forming layer 19; the epitaxial semiconductor layer 3; the source or drain electrode metal 101; the drain or source electrode metal 102; the gate electrode metal 106; the surface protective film 105; the source or drain pad electrode metal 107; and the drain or source pad electrode metal 108.

The diamond substrate 23 directly contacts the adhesion layer or core forming layer 19 to form a joint interface 24. The epitaxial semiconductor layer 2 directly contacts the adhesion layer or core forming layer 19 to form a joint interface 21.

The adhesion layer or core forming layer 19 is made using a material that is generally an amorphous material such as amorphous Si or Si nitride, for example. Alternatively, the adhesion layer or core forming layer 19 may be made of a crystal material.

To grow the epitaxial semiconductor layer 2 in the recess 17 of the diamond substrate 23, diamond nanoparticles called diamond seed may be used as a material of the adhesion layer or core forming layer 19. From a viewpoint of heat dissipation efficiency, the thickness of the adhesion layer or core forming layer 19 is desirably equal to or less than 50 nm, for example.

In the foregoing configuration of the semiconductor device, the provision of the adhesion layer or core forming layer 19 between the diamond substrate 23 and the epitaxial semiconductor layer 2 makes it possible to reduce the occurrence of film separation or defect, or mixture of a crack, etc. between the diamond substrate 23 and the epitaxial semiconductor layer 2. This achieves improvement of adhesion at a joint between different types of materials.

Third Embodiment

A semiconductor device and a method of manufacturing the semiconductor device relating to the present embodiment will be described below. In the description given below, a component similar to the component described in the foregoing embodiments will be given the same sign and illustrated with the same sign in the drawing. Detailed description of this component will be omitted, where appropriate.

<Configuration of Semiconductor Device>

FIG. 3 is a cross-sectional view schematically showing another example of the configuration of the semiconductor device relating to the present embodiment. Unlike in the configurations shown in the examples of FIGS. 1 and 2, in the configuration show in the example of FIG. 3, the position of a projection 16A does not correspond to the element-to-element isolation region 202. Specifically, in the configuration shown in the example of FIG. 3, a recess 17A of a diamond substrate 23A has a narrow width, namely, the projection 16A of the diamond substrate 23A has a wide width. The projection 16A is formed to extend to a position directly below the source or drain electrode metal 101 adjacent to the projection 16A and to a position directly below the drain or source electrode metal 102 adjacent to the projection 16A.

As shown in the example of FIG. 3, the semiconductor device includes: the diamond substrate 23A; an adhesion layer or a core forming layer 19A formed to cover the projection 16A and the recess 17A of the diamond substrate 23A; an epitaxial semiconductor layer 2A formed in the recess 17A of the diamond substrate 23A covered by the adhesion layer or core forming layer 19A; an epitaxial semiconductor layer 3A formed on the upper surface of the epitaxial semiconductor layer 2A; the source or drain electrode metal 101 formed partially on the upper surface of the projection 16A covered by the adhesion layer or core forming layer 19A; the drain or source electrode metal 102 formed partially on the upper surface of the projection 16A covered by the adhesion layer or core forming layer 19A; the gate electrode metal 106 formed partially on an upper surface 401A of the epitaxial semiconductor layer 3A; the surface protective film 105 formed partially on the upper surface of the projection 16A and on the upper surface 401A of the epitaxial semiconductor layer 3A; the source or drain pad electrode metal 107; and the drain or source pad electrode metal 108. The adhesion layer or core forming layer 19A may be omitted from FIG. 3.

The diamond substrate 23A directly contacts the adhesion layer or core forming layer 19A to form a joint interface 24A. The epitaxial semiconductor layer 2A directly contacts the adhesion layer or core forming layer 19A to form a joint interface 21A.

In the foregoing configuration of the semiconductor device, the field-effect transistor 201 is surrounded on four sides at shorter distances in a plan view by the diamond substrate 23A as a high heat conductivity material.

Heat is generated in an active region in the field-effect transistor 201. For this reason, surrounding the active region on four sides in a plan view by the high heat conductivity material causes the semiconductor device relating to the present embodiment to achieve high heat dissipation efficiency.

Fourth Embodiment

A semiconductor device and a method of manufacturing the semiconductor device relating to the present embodiment will be described below. In the description given below, a component similar to the component described in the foregoing embodiments will be given the same sign and illustrated with the same sign in the drawing. Detailed description of this component will be omitted, where appropriate.

<Configuration of Semiconductor Device>

A monolithic microwave integrated circuit (in short, an MIMIC) used in a microwave communication system or a millimeter wave communication system, for example, is configured using an HEMT device.

A multi-finger HEMT including a plurality of unit HEMTs electrically connected in parallel is used as an HEMT device in a high-output power amplifier of an MMIC.

In the multi-finger HEMT, the unit HEMTs connected to each other in parallel generate heat of a non-negligible amount. In particular, at a unit HEMT device located near the center of the multi-finger HEMT, concentration of heat occurs as a result of influence of heat generation from surrounding unit HEMT devices to reduce heat dissipation efficiency. As a result, the unit HEMT device near the center of the multi-finger HEMT is prone to breakdown.

Thus, a configuration of high heat dissipation efficiency is required to be used for improving the performance of the multi-finger HEMT in a high-output power amplifier.

Figure 4:
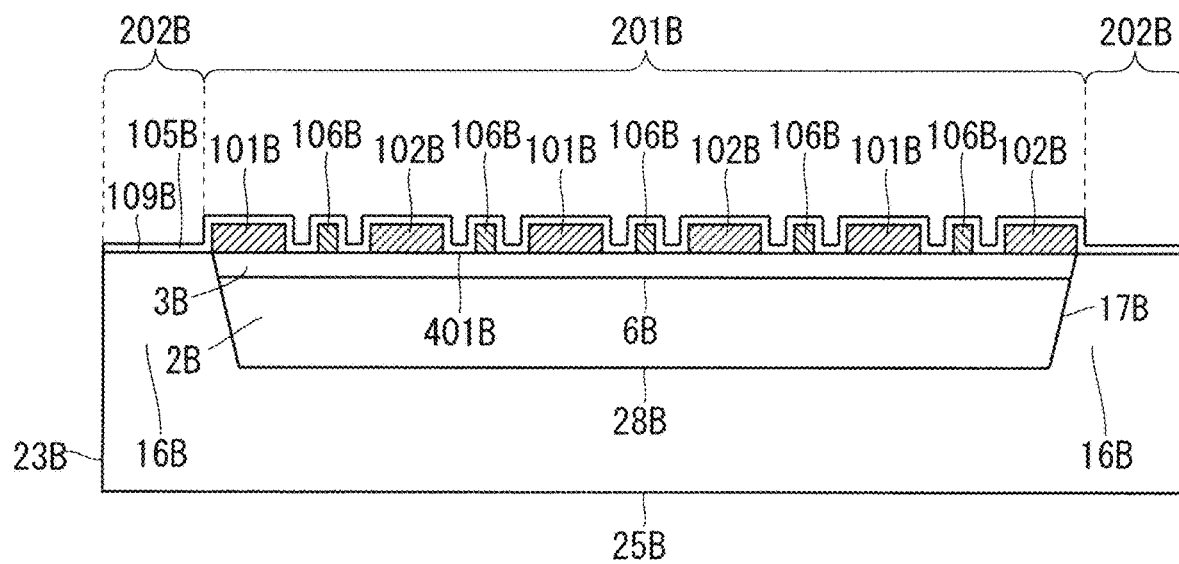
FIG. 4 is a cross-sectional view schematically showing an example of the configuration of the semiconductor device relating to the embodiment.

FIG. 4 is a cross-sectional view schematically showing an example of the configuration of the semiconductor device relating to the present embodiment. The semiconductor device shown in the example of FIG. 4 is a multi-finger field-effect transistor with a plurality of field-effect transistors electrically connected in parallel.

The field-effect transistors connected in parallel may be MIS devices, MOS devices, or HEMT devices, for example. Here, multi-finger HEMTs are described as an example.

As shown in the example of FIG. 4, the semiconductor device includes: a diamond substrate 23B; an epitaxial semiconductor layer 2B formed in a recess 17B of the diamond substrate 23B; an epitaxial semiconductor layer 3B formed on the upper surface of the epitaxial semiconductor layer 2B; a source or drain electrode metal 101B formed partially on an upper surface 401B of the epitaxial semiconductor layer 3B; a drain or source electrode metal 102B formed partially on the upper surface 401B of the epitaxial semiconductor layer 3B; a gate electrode metal 106B formed partially on the upper surface 401B of the epitaxial semiconductor layer 3B; and a surface protective film 105B formed to cover the upper surface 401B of the epitaxial semiconductor layer 3B and an upper surface 109B of a projection 16B.

The diamond substrate 23B has the upper surface 109B and a lower surface 25B. The projection 16B is formed at the upper surface 109B of the diamond substrate 23B. The recess 17B surrounded on four sides by the projection 16B in a plan view is filled with the epitaxial semiconductor layer 2B and the epitaxial semiconductor layer 3B.

Examples of a material of the epitaxial semiconductor layer 2B and the epitaxial semiconductor layer 3B include Si, GaAs, SiC, and $Ga_2O_3$.

While the epitaxial semiconductor layer 2B and the epitaxial semiconductor layer 3B are stacked in the present embodiment, a single epitaxial semiconductor layer may be formed in the recess 17B.

A multi-finger HEMT 201B is formed on the upper surface 401B of the epitaxial semiconductor layer 3B. In the multi-finger HEMT 201B formed on the upper surface 401B of the epitaxial semiconductor layer 3B, unit HEMTs each including the source or drain electrode metal 101B, the drain or source electrode metal 102B, and the gate electrode metal 106B are electrically connected in parallel via a drain line, a gate line, and a source line.

Any shape conforming to a purpose of the present embodiment is applicable to the shape of the gate electrode metal 106B. A field plate electrode metal may be formed on the upper surface of the gate electrode metal 106B.

In the multi-finger HEMT 201B, the number of unit HEMT devices connected in parallel may be determined arbitrarily.

The surface protective film 105B is formed at least in one layer on the upper surface 401B of the epitaxial semiconductor layer 3B in a region without an electrode and on the electrodes. The surface protective film 105B functions to control an electric field or surface potential, to provide inactivation, water resistance, or moisture resistance of a surface level, etc.

An element-to-element isolation region 202B is provided in a gap between adjacent multi-finger HEMTs 201B. The element-to-element isolation region 202B is formed on the projection 16B at the upper surface 109B of the diamond substrate 23B.

In the foregoing configuration of the semiconductor device, the multi-finger HEMT 201B is surrounded on four sides in a plan view by the diamond substrate 23B as a high heat conductivity material.

Heat is generated in an active region in the multi-finger HEMT 201B. For this reason, surrounding the active region on four sides in a plan view by the high heat conductivity material causes the semiconductor device relating to the present embodiment to achieve high heat dissipation efficiency. Additionally, the epitaxial semiconductor layer 2B and the diamond substrate 23B directly contact each other to form a joint interface 28B, thereby reducing influence of interface thermal resistance. This allows dissipation of heat seamlessly (in a state without a seam).

Diamond is a material generally having high electrical insulating properties. Thus, if the diamond substrate 23B applied to the present embodiment has electric resistivity sufficiently higher at least than that of the epitaxial semiconductor layer 2B or that of the epitaxial semiconductor layer 3B, the projection 16B of the diamond substrate 23B becomes capable of fulfilling the function of element-to-element isolation.

In a process of forming the HEMT device, an element-to-element isolation step is generally required, and this step is performed by a technique using dry etching process for physically eliminating two-dimensional electron gas to become carriers, or by a technique using selective ion implantation process for physically destroying epitaxial semiconductor crystal in a region corresponding to an element isolation region.

By contrast, in the configuration of the semiconductor device shown in the example of FIG. 4, the presence of the electrical insulating properties of crystal diamond allows simplification of the complicated element-to-element isolation step described above.

Fifth Embodiment

A semiconductor device and a method of manufacturing the semiconductor device relating to the present embodiment will be described below. In the description given below, a component similar to the component described in the foregoing embodiments will be given the same sign and illustrated with the same sign in the drawing. Detailed description of this component will be omitted, where appropriate.

<Configuration of Semiconductor Device>

In FIG. 4, the epitaxial semiconductor layer 2B and the diamond substrate 23B directly contact each other. In a configuration described in the present embodiment, the epitaxial semiconductor layer 2B and the diamond substrate 23B do not directly contact each other.

Figure 5:
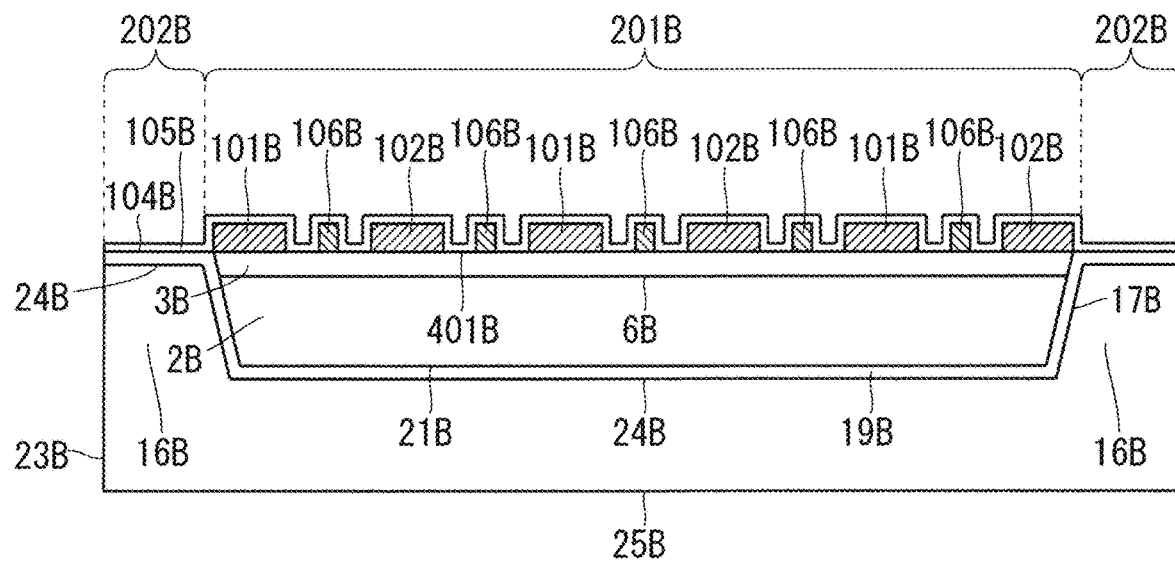
FIG. 5 is a cross-sectional view schematically showing an example of the configuration of the semiconductor device relating to the embodiment.

FIG. 5 is a cross-sectional view schematically showing an example of the configuration of the semiconductor device relating to the present embodiment. As shown in the example of FIG. 5, the semiconductor device includes: the diamond substrate 23B; an adhesion layer or a core forming layer 19B formed to cover the projection 16B and the recess 17B of the diamond substrate 23B; the epitaxial semiconductor layer 2B formed in the recess 17B of the diamond substrate 23B covered by the adhesion layer or core forming layer 19B; the epitaxial semiconductor layer 3B; the source or drain electrode metal 101B; the drain or source electrode metal 102B; the gate electrode metal 106B; and the surface protective film 105B.

The diamond substrate 23B directly contacts the adhesion layer or core forming layer 19B to form a joint interface 24B. The epitaxial semiconductor layer 2B directly contacts the adhesion layer or core forming layer 19B to form a joint interface 21B.

The adhesion layer or core forming layer 19B is made using a material that is generally an amorphous material such as amorphous Si or Si nitride, for example. Alternatively, the adhesion layer or core forming layer 19B may be made of a crystal material.

To grow the epitaxial semiconductor layer 2B in the recess 17B of the diamond substrate 23B, diamond nanoparticles may be used as a material of the adhesion layer or core forming layer 19B. From a viewpoint of heat dissipation efficiency, the thickness of the adhesion layer or core forming layer 19B is desirably equal to or less than 50 nm, for example.

In the foregoing configuration of the semiconductor device, the provision of the adhesion layer or core forming layer 19B between the diamond substrate 23B and the epitaxial semiconductor layer 2B makes it possible to reduce the occurrence of film separation or defect, or mixture of a crack, etc. between the diamond substrate 23B and the epitaxial semiconductor layer 2B. This achieves improvement of adhesion at a joint between different types of materials.

Sixth Embodiment

A semiconductor device and a method of manufacturing the semiconductor device relating to the present embodiment will be described below. In the description given below, a component similar to the component described in the foregoing embodiments will be given the same sign and illustrated with the same sign in the drawing. Detailed description of this component will be omitted, where appropriate.

<Configuration of Semiconductor Device>

Figure 6:
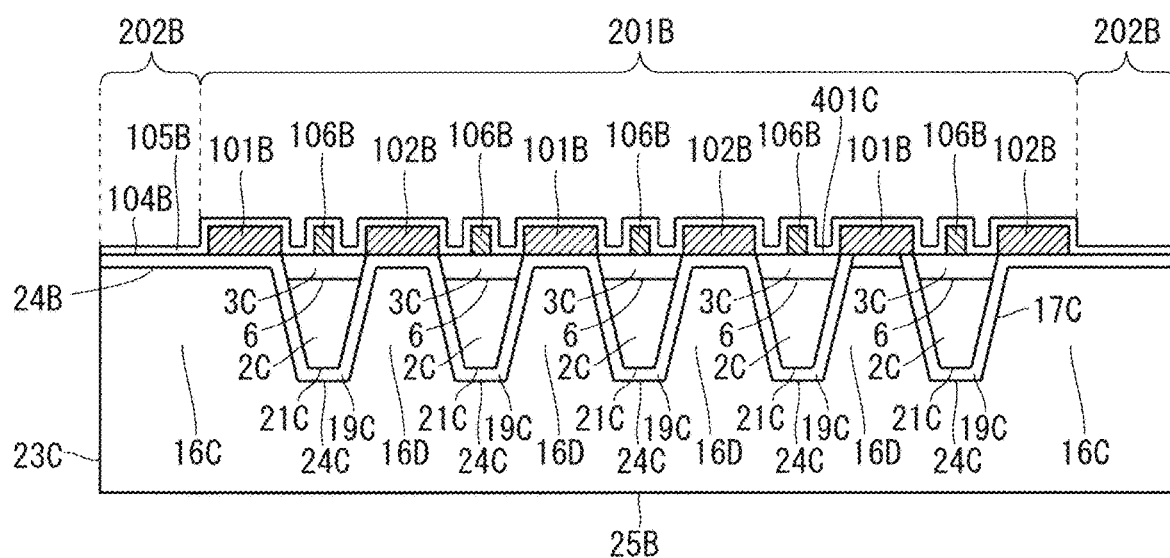
FIG. 6 is a cross-sectional view schematically showing another example of the configuration of the semiconductor device relating to the embodiment.

FIG. 6 is a cross-sectional view schematically showing another example of the configuration of the semiconductor device relating to the present embodiment. Unlike in the configurations shown in the examples of FIGS. 4 and 5, in the configuration show in the example of FIG. 6, the position of a projection 16C does not correspond to the element-to-element isolation region 202B. Specifically, in the configuration shown in the example of FIG. 6, a recess 17C of a diamond substrate 23C has a narrow width, and has a plurality of recesses 17C formed between adjacent projections 16C. The projection 16C is formed to extend to a position directly below the source or drain electrode metal 101B adjacent to the projection 16C and to a position directly below the drain or source electrode metal 102B adjacent to the projection 16C.

As shown in the example of FIG. 6, the semiconductor device includes: the diamond substrate 23C; an adhesion layer or a core forming layer 19C formed to cover the projection 16C and the recess 17C of the diamond substrate 23C; an epitaxial semiconductor layer 2C formed in the recess 17C of the diamond substrate 23C covered by the adhesion layer or core forming layer 19C; an epitaxial semiconductor layer 3C formed on the upper surface of the epitaxial semiconductor layer 2C; the source or drain electrode metal 101B formed partially on the upper surface of the projection 16C covered by the adhesion layer or core forming layer 19C and formed on the upper surface of a projection 16D between a plurality of the recesses 17C formed between adjacent projections 16C; the drain or source electrode metal 102B formed partially on the upper surface of the projection 16C covered by the adhesion layer or core forming layer 19C and formed on the upper surface of the projection 16D between a plurality of the recesses 17C; the gate electrode metal 106B formed partially on an upper surface 401C of the epitaxial semiconductor layer 3C; and the surface protective film 105B formed to cover the upper surface 401C of the epitaxial semiconductor layer 3C and the upper surface of the projection 16C. The adhesion layer or core forming layer 19C may be omitted from FIG. 6.

The diamond substrate 23C directly contacts the adhesion layer or core forming layer 19C to form a joint interface 24C. The epitaxial semiconductor layer 2C directly contacts the adhesion layer or core forming layer 19C to form a joint interface 21C.

In the foregoing configuration of the semiconductor device, the multi-finger HEMT 201B is surrounded on four sides at shorter distances in a plan view by the diamond substrate 23C as a high heat conductivity material.

Heat is generated in an active region in the multi-finger HEMT 201B and concentrates particularly on the center of the multi-finger HEMT 201B. For this reason, surrounding the active region on four sides in a plan view by the high heat conductivity material causes the semiconductor device relating to the present embodiment to achieve high heat dissipation efficiency.

Seventh Embodiment

A semiconductor device and a method of manufacturing the semiconductor device relating to the present embodiment will be described below. In the description given below, a component similar to the component described in the foregoing embodiments will be given the same sign and illustrated with the same sign in the drawings. Detailed description of this component will be omitted, where appropriate.

<Configuration of Semiconductor Device>

Figure 7:
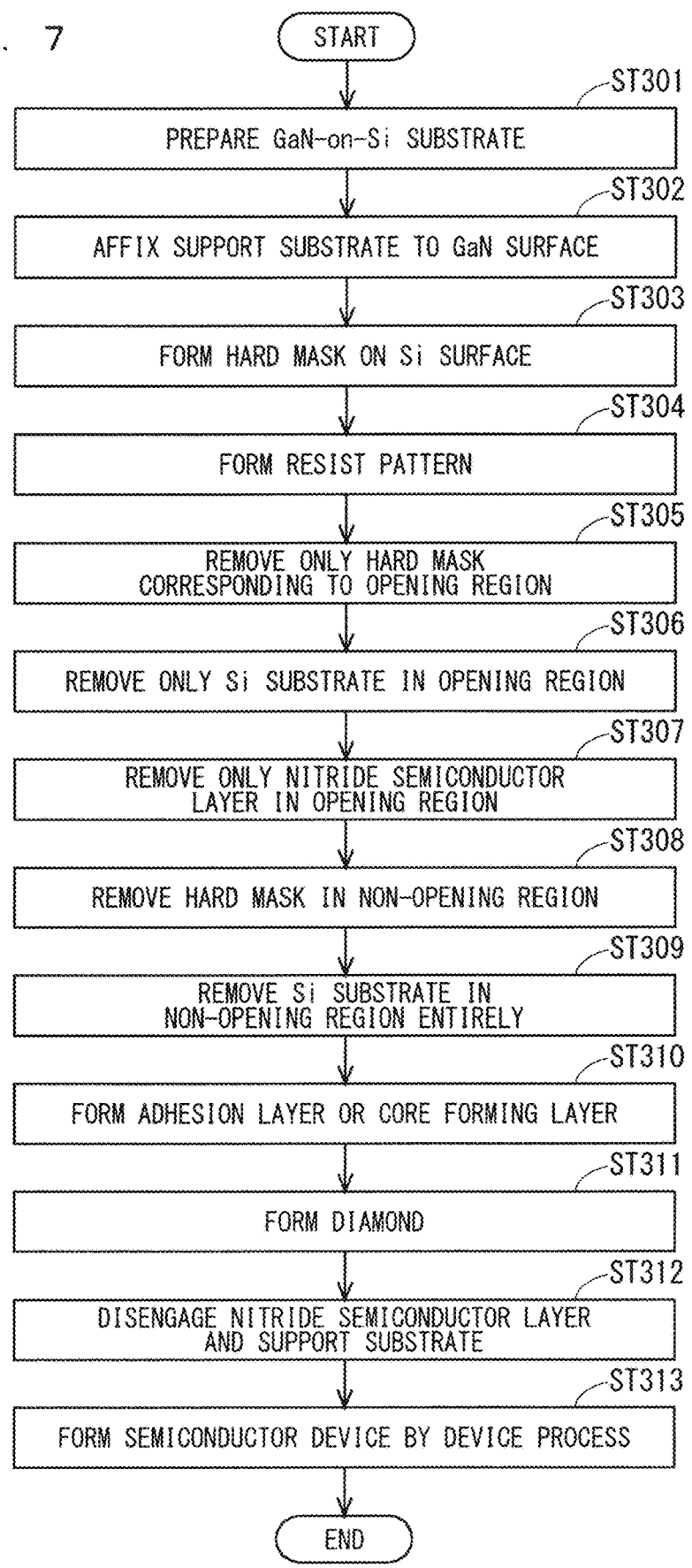
FIG. 7 is a flowchart showing an example of a method of manufacturing the semiconductor device according to the embodiment.

FIG. 7 is a flowchart showing an example of a method of manufacturing the semiconductor device according to the embodiments described above. FIGS. 9 to 17 are cross-sectional views showing exemplary steps of manufacturing the semiconductor device relating to the present embodiment. A method of manufacturing the semiconductor device relating to the present embodiment will be described below by referring to FIG. 7 and FIGS. 9 to 17.

Figure 9:
FIG. 9 is a cross-sectional view showing an exemplary step of manufacturing the semiconductor device relating to the embodiment.

First, in step ST301, a GaN-on-Si substrate 303 with a GaN layer 302 formed on the upper surface of an Si substrate 301 is prepared as a starting substrate for manufacturing process (see FIG. 9, for example). In the manufacturing method relating to the present embodiment, while the GaN-on-Si substrate 303 is shown as an example of the starting substrate, the starting substrate may also be a GaN-on-sapphire substrate or a GaN-on-SiC substrate, for example.

Figure 10:
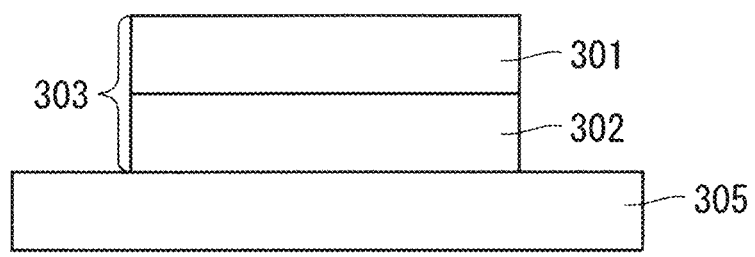
FIG. 10 is a cross-sectional view showing an exemplary step of manufacturing the semiconductor device relating to the embodiment.

Then, in step ST302, a support substrate 305 is affixed to a surface of the GaN layer 302 of the GaN-on-Si substrate 303 (see FIG. 10, for example). As the support substrate 305, an Si substrate, a sapphire substrate, or a quarts substrate is used, for example.

Planarization is preferably performed beforehand in such a manner as to provide arithmetic mean roughness (Ra) of equal to or less than 30 nm on the GaN surface. This also applies to a surface of affixation of the support substrate 305.

The support substrate 305 is affixed to the surface of the GaN layer 302 of the GaN-on-Si substrate 303 by a bonding method that may be hydrophilization bonding, pressure bonding, or plasma activation bonding, for example, or by an adhesive method using an inorganic adhesive material, etc. An optional interlayer film may be provided at a plane of the affixation between the surface of the GaN layer 302 of the GaN-on-Si substrate 303 and the surface of the support substrate 305. This interlayer film is desirably made of a material such as an Si nitride or aluminum film generally used as a semiconductor protective film.

In this way, the surfaces of the support substrate 305 and the GaN layer 302 can be joined to each other to form a composite substrate.

Figure 11:
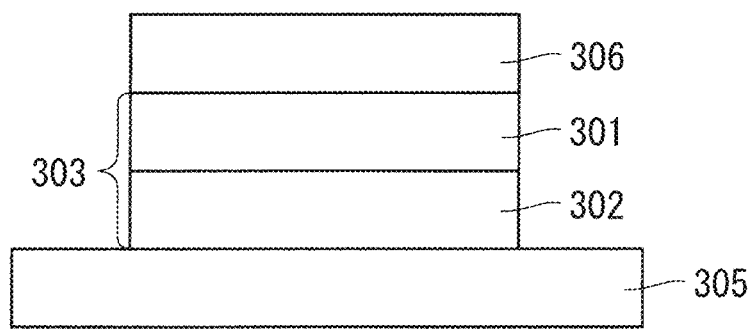
FIG. 11 is a cross-sectional view showing an exemplary step of manufacturing the semiconductor device relating to the embodiment.

Then, in step ST303, a hard mask 306 is formed on a surface of the Si substrate 301 of the starting substrate of the composite substrate formed by joining the surfaces of the support substrate 305 and the GaN layer 302 of the GaN-on-Si substrate 303 (see FIG. 11, for example).

The hard mask 306 desirably has resistance to dry etching and is made of a material having selectivity of etching to Si or GaN. The material of the hard mask 306 may be Si nitride, an aluminum film, or silicon dioxide, for example.

These materials may be formed by physical vapor deposition (in short, PVD) process that may be sputtering or vapor deposition process, or by chemical vapor deposition (in short, CVD) process that may be reduced pressure chemical vapor deposition process, plasma-assisted chemical vapor deposition process, or atomic layer deposition process, for example.

The foregoing hard mask 306 may have a configuration of one or more layers responsive to selectivity in each step of forming a through groove corresponding to step ST304 and its subsequent steps.

Then, in step ST304, a resist pattern for forming a through groove is formed in the hard mask 306 prepared in step ST303. The resist pattern for the through groove is required to be formed in such a manner as to surround a region on four sides in a plan view in which the semiconductor device relating to the present embodiment is to be formed.

The resist pattern for the through groove may be formed using a technique such as photolithography technique, for example. An opening region 307 in the resist pattern for formation of the through groove is a region in which the hard mask 306 is exposed to external environment. On the other hand, a non-opening region other than the opening region 307 for formation of the through groove is a region in which the hard mask 306 is protected by a resist.

Figure 12:
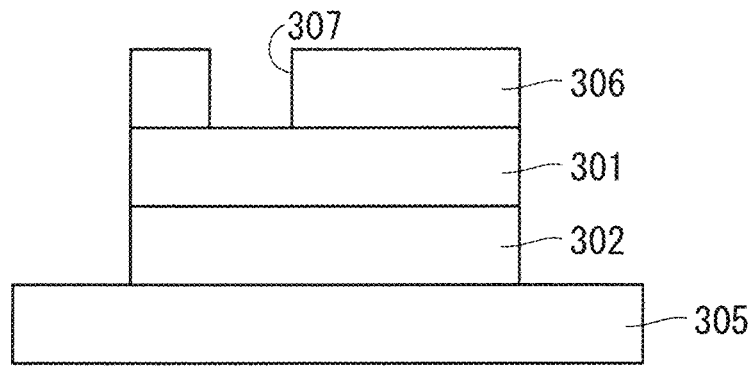
FIG. 12 is a cross-sectional view showing an exemplary step of manufacturing the semiconductor device relating to the embodiment.

Then, in step ST305, only the hard mask 306 corresponding to the opening region 307 exposed to external environment is removed (see FIG. 12, for example). The hard mask 306 is removed by a technique selected from wet etching by means of immersion into a chemical and dry etching.

After the hard mask 306 is removed, the surface of the Si substrate 301 in the opening region 307 is further exposed to external environment. Next, the resist pattern is separated from the hard mask 306 to expose the hard mask 306 corresponding to the non-opening region to external environment.

Figure 13:
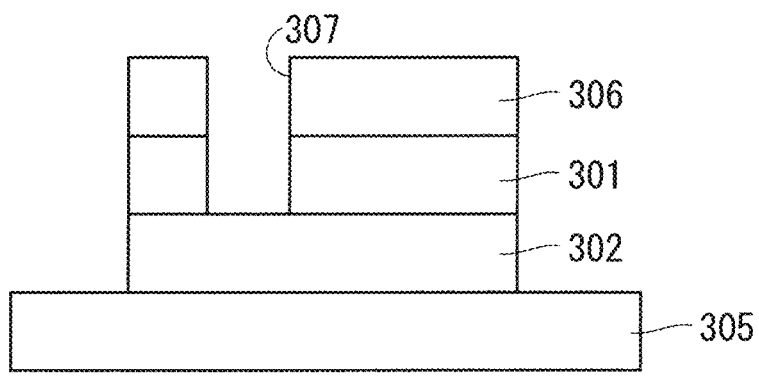
FIG. 13 is a cross-sectional view showing an exemplary step of manufacturing the semiconductor device relating to the embodiment.

Then, in step ST306, only the Si substrate 301 in the opening region 307 exposed to external environment is removed (see FIG. 13, for example). As a result of this process, the Si substrate 301 having a thickness of several hundreds of micrometers is removed partially.

After the Si substrate 301 is removed, the GaN layer 302 corresponding to the opening region 307 is exposed to external environment. On the other hand, removing the hard mask 306 completely in the non-opening region is not permitted during implementation of step ST306.

Figure 14:
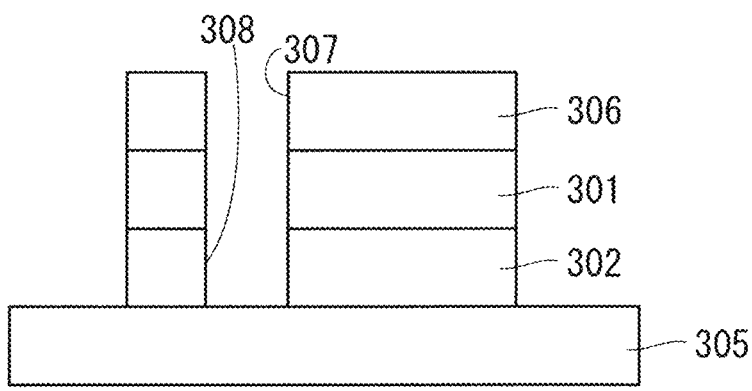
FIG. 14 is a cross-sectional view showing an exemplary step of manufacturing the semiconductor device relating to the embodiment.

Then, in step ST307, only the GaN layer 302 exposed to external environment and corresponding to the opening region 307 is removed (see FIG. 14, for example). The GaN layer 302 is removed by a technique of partially removing the GaN layer 302 of a thickness from several micrometers to several tens of micrometers, for example.

After the GaN layer 302 is removed, in a region corresponding to the opening region 307, a surface of joint with the support substrate 305 is exposed to external environment. On the other hand, removing the hard mask 306 completely in the non-opening region is not permitted during implementation of step ST307.

As a result of implementation of the foregoing steps up to step ST307, a through groove 308 is formed in the GaN-on-Si substrate 303. Forming the through groove 308 achieves two effects described below.

A first effect is to allow formation of a semiconductor device configuration characteristic to the present embodiment. A second effect is to reduce the occurrence of a crack or a fracture in the GaN layer 302 to be caused in the substrate removal step by stress release.

Next, in step ST308, the hard mask 306 in the non-opening region is removed. In step ST308, the hard mask 306 is desirably removed by a technique using dry etching process.

Dry etching has anisotropy in a way in which the etching develops. The GaN layer 302 and the Si substrate 301 exist on a lateral side of a region in which the through groove 308 is formed. Dry etching is used to suppress development of the etching on the GaN layer 302 and the Si substrate 301.

After the hard mask 306 is removed, the island-shape Si substrate 301 is exposed to external environment in the non-opening region.

Figure 15:
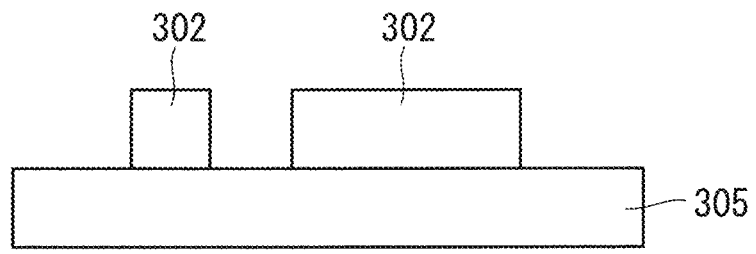
FIG. 15 is a cross-sectional view showing an exemplary step of manufacturing the semiconductor device relating to the embodiment.

Then, in step ST309, the Si substrate 301 in the non-opening region exposed to external environment is removed entirely (see FIG. 15, for example). According to a technique of removing the Si substrate 301, after the Si substrate 301 is removed, the GaN layer 302 is exposed to external environment.

At this time, to planarize an etching surface, planarization may be performed additionally such as chemical mechanical polishing (in short, CMP) or machining, for example.

Then, in step ST310, an adhesion layer or a core forming layer is formed. Step ST310 may be omitted. As a result of omission of step ST310, the configuration of a resultant semiconductor device and effect resulting from this configuration are the same as those described above in the first embodiment and the fourth embodiment.

The adhesion layer or core forming layer is formed for the purpose of improving adhesion during growth or joining of a diamond substrate in step ST311 and its subsequent steps.

The adhesion layer or core forming layer is made using a material that is generally an amorphous material such as amorphous Si or Si nitride, for example. Alternatively, the adhesion layer or core forming layer may be made using a material having excellent heat conductivity such as diamond nanoparticles, diamond-like carbon, graphene, or graphite, for example.

The adhesion layer or core forming layer is required to be formed in such a manner as to further cover the interior of the through groove 308. At this time, to planarize a surface of the adhesion layer or core forming layer, planarization may be performed additionally such as CMP or machining, for example.

Figure 16:
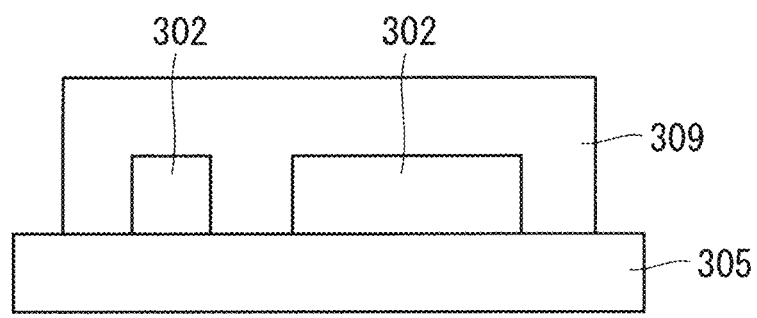
FIG. 16 is a cross-sectional view showing an exemplary step of manufacturing the semiconductor device relating to the embodiment.

Then, in step ST311, a diamond layer 309 is formed on the upper surface of the GaN layer 302 and in the through groove (see FIG. 16, for example). The diamond layer 309 may be formed by a technique such as vapor deposition that may be microwave CVD process using $CH_4$—$H_2$—$O_2$ based gas or hot filament CVD process, or process of joining to a freestanding diamond substrate, for example.

If the vapor deposition is used, a thickness is required to be increased sufficiently for freestanding. If the process of joining is used, the freestanding substrate is required to be processed to conform to the through groove 308.

As a result of the foregoing, a structure with the GaN layer 302 formed in a recess at the upper surface of the diamond substrate can be provided. Diamond to be formed desirably has high electrical insulating properties. The diamond layer 309 is desirably formed to fill in the interior of the through groove 308 completely without any space.

Diamond to be formed has crystalline nature that may either be single-crystalline or poly-crystalline nature. Further, single crystal having long-range order achieves more excellent heat transport characteristics of diamond to be formed. Thus, diamond to be formed desirably has larger crystal particles and higher crystalline nature.

Figure 17:
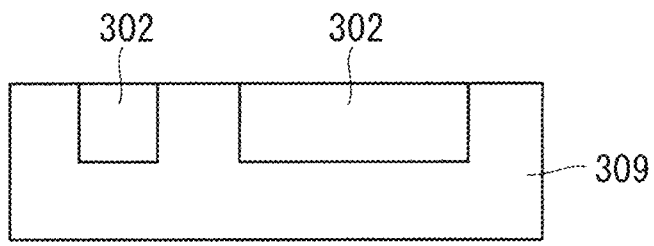
FIG. 17 is a cross-sectional view showing an exemplary step of manufacturing the semiconductor device relating to the embodiment.

Then, in step ST312, the GaN layer 302 and the support substrate 305 are disengaged (see FIG. 17, for example). For example, wet etching process using a chemical may be employed in a step of the disengagement. Care should be taken not to damage a structure with the chemical other than the disengaged part.

Then, in step S313, the surface of the GaN layer 302 is exposed to environment. This surface of the GaN layer 302 is subjected to device process such as electrode formation, thereby providing the configuration of the semiconductor device relating to the present embodiment.

In the configuration of the semiconductor device described above, the through groove 308 is formed before the Si substrate 301 is removed entirely, thereby distributing stress release due to lattice mismatch between different types of materials. This makes it possible to reduce development of a crack or a fracture into the GaN layer 302 or into the semiconductor device.

As the through groove 308 is filled with diamond having high electrical insulating properties, diamond becomes capable of fulfilling the function of element-to-element isolation. This makes it possible to simplify an element-to-element isolation step during the device process.

The element-to-element isolation step can be omitted by employing selective ion implantation process for this step, for example. Additionally, omitting the selective ion implantation process achieves a higher degree of freedom in the process in terms of permission of high-temperature thermal history, for example.

Eighth Embodiment

A semiconductor device and a method of manufacturing the semiconductor device relating to the present embodiment will be described below. In the description given below, a component similar to the component described in the foregoing embodiments will be given the same sign and illustrated with the same sign in the drawings. Detailed description of this component will be omitted, where appropriate.

<Configuration of Semiconductor Device>

FIG. 8 is a flowchart showing another example of a method of manufacturing the semiconductor device shown in the examples of FIGS. 1 to 6. FIGS. 18 to 23 are cross-sectional views showing exemplary steps of manufacturing the semiconductor device relating to the present embodiment. A method of manufacturing the semiconductor device relating to the present embodiment will be described below by referring to FIG. 8 and FIGS. 18 to 23.

Figure 18:
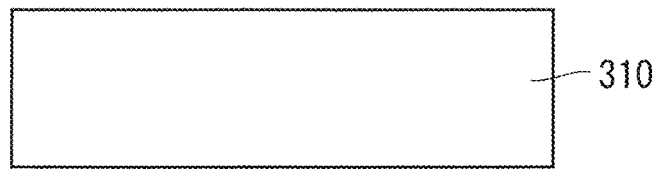
FIG. 18 is a cross-sectional view showing an exemplary step of manufacturing the semiconductor device relating to the embodiment.

First, as shown in an example as step ST401, according to this manufacturing method, a freestanding diamond substrate 310 is prepared as a starting substrate (see FIG. 18, for example). The freestanding diamond substrate 310 used in the present embodiment has desirably high electrical insulating properties. To planarize a surface of the freestanding diamond substrate 310, planarization may be performed additionally such as CMP or machining, for example.

Figure 19:
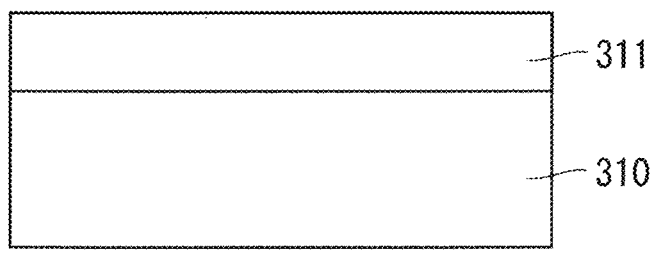
FIG. 19 is a cross-sectional view showing an exemplary step of manufacturing the semiconductor device relating to the embodiment.

Next, in step ST402, a hard mask 311 is formed on the surface of the freestanding diamond substrate 310 (see FIG. 19, for example). The hard mask 311 desirably has resistance to dry etching and is made of a material having selectivity of etching to diamond. The material of the hard mask 311 may be Si nitride, an aluminum film, or silicon dioxide, for example.

These materials may be formed by a technique such as PVD process or CVD process, for example. The hard mask 311 may have a configuration of one or more layers.

Then, in step ST403, a resist pattern for forming a recess in the freestanding diamond substrate 310 is formed in the hard mask 311 prepared in step ST402. The resist pattern for the recess is required to be formed in such a manner as to surround a region on four sides in a plan view in which the semiconductor device relating to the present embodiment is to be formed.

The resist pattern for the recess may be formed by a technique using photolithography technique, for example. An opening region 312 in the resist pattern for formation of the recess is a region in which the hard mask 311 is exposed to external environment. On the other hand, a non-opening region other than the opening region 312 for formation of the recess is a region in which the hard mask 311 is protected by a resist.

Figure 20:
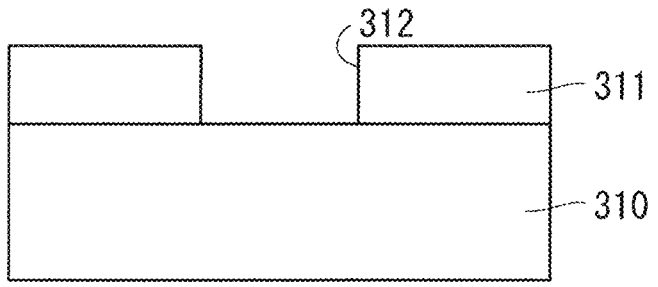
FIG. 20 is a cross-sectional view showing an exemplary step of manufacturing the semiconductor device relating to the embodiment.
Figure 21:
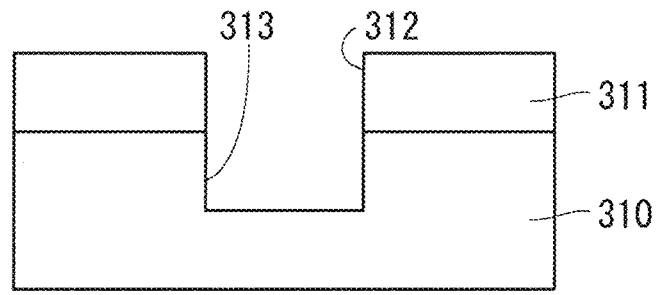
FIG. 21 is a cross-sectional view showing an exemplary step of manufacturing the semiconductor device relating to the embodiment.

Then, in step ST404, only the hard mask 311 corresponding to the opening region 312 exposed to external environment is removed (see FIG. 20, for example). The hard mask 311 is removed by a technique selected from wet etching by means of immersion into a chemical and dry etching.

After the hard mask 311 is removed, the surface of the freestanding diamond substrate 310 in the opening region 312 is further exposed to external environment. Next, the resist pattern is separated from the hard mask 311 to expose the hard mask 311 corresponding to the non-opening region to external environment.

Then, in step ST405, only the freestanding diamond substrate 310 in the opening region 312 exposed to external environment is removed partially. Then, a recess 313 is formed in a region corresponding to the opening region 312 (see FIG. 21, for example). The diamond substrate in the opening region 312 can be removed by a method employing any process conforming to the purpose of the present embodiment.

An amount of removal of the freestanding diamond substrate 310 is required to be controlled properly to a thickness conforming to the size of the semiconductor device to be manufactured. For this reason, removing the freestanding diamond substrate 310 through the entire opening region 312 is beyond the scope of assumption.

After the freestanding diamond substrate 310 is removed partially, an etching surface of the freestanding diamond substrate 310 in the opening region 312, namely, the recess 313 is exposed to external environment. At this time, to planarize the etching surface of the freestanding diamond substrate 310, planarization may be performed additionally such as CMP or machining, for example.

Figure 22:
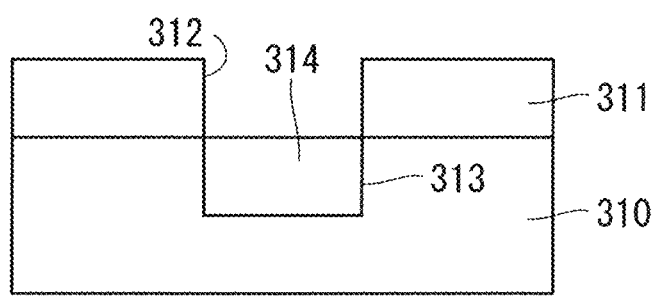
FIG. 22 is a cross-sectional view showing an exemplary step of manufacturing the semiconductor device relating to the embodiment.

Then, in step ST406, a nitride semiconductor layer 314 is formed on the etching surface of the freestanding diamond substrate 310, namely, in the recess 313 exposed to external environment (see FIG. 22, for example). The nitride semiconductor layer 314 may be formed by a method employing metal organic chemical vapor deposition (in short, MOCVD) process or molecular beam epitaxy (in sort, MBE) process, for example. Also, a technique of causing crystal growth of nitride semiconductor on a graphene film reported by J. W. Shon et al. is applicable (J. W. Shon, J. Ohta, K, Ueno, A. Kobayashi, and H. Fujioka, "Structural Properties of GaN films grown on multilayer graphene films by pulsed sputtering," Appl. Phys. Express 7,085502 (2014)). Any other crystal growth techniques conforming to the purpose of the semiconductor device relating to the present embodiment are also applicable.

The nitride semiconductor layer 314 is only required to be formed into at least one layer. In the case of an HEMT device, for example, a first epitaxial semiconductor layer to become an electron transit layer and a second epitaxial semiconductor layer to become a barrier layer are formed for generating 2DEG.

The nitride semiconductor layer 314 to be grown is required to be controlled in thickness and is required to be grown to the same height as a surface corresponding to a non-etching surface of the freestanding diamond substrate 310.

The adhesion layer or core forming layer described in the second embodiment or the fifth embodiment may be provided between the freestanding diamond substrate 310 and the nitride semiconductor layer 314. Also, a lattice relaxation layer for relaxing lattice mismatch between the freestanding diamond substrate 310 and the nitride semiconductor layer 314 may be provided therebetween.

After the nitride semiconductor layer 314 is formed, a surface of the nitride semiconductor layer 314 in the opening region 312 is exposed to external environment. At this time, to planarize the surface of the nitride semiconductor layer 314, planarization may be performed additionally such as CMP or machining, for example.

Figure 23:
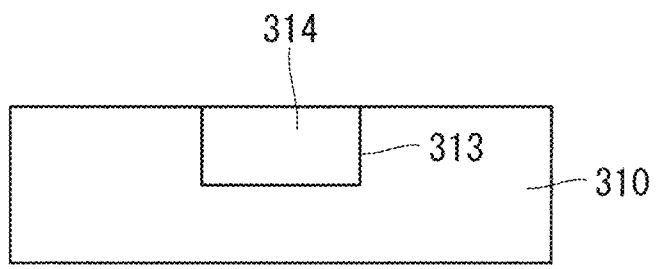
FIG. 23 is a cross-sectional view showing an exemplary step of manufacturing the semiconductor device relating to the embodiment.

Then, in step ST407, the hard mask 311 is removed from the surface of the freestanding diamond substrate 310 in the non-opening region (see FIG. 23, for example). The hard mask 311 is removed in step ST407 by a technique that may either be wet etching using a chemical or dry etching.

If a chemical to be used allows the nitride semiconductor layer 314 to be resistant to this chemical, the removal process using wet etching causes little effect in terms of influence of damage on the nitride semiconductor layer 314 and allows removal of the hard mask 311 in a simple way.

Then, in step ST408, the surface of the nitride semiconductor layer 314 is subjected to device process such as electrode formation, thereby providing the configuration of the semiconductor device relating to the present embodiment.

In the foregoing configuration of the semiconductor device, diamond having high electrical insulating properties surrounds the nitride semiconductor layer 314 on four sides in a plan view to allow the freestanding diamond substrate 310 to fulfill the function of element-to-element isolation. This achieves simplification of an element-to-element isolation step during the device process.

The element-to-element isolation step can be omitted by employing selective ion implantation process for this step, for example. Additionally, omitting the selective ion implantation process achieves a higher degree of freedom in the process in terms of permission of high-temperature thermal history, for example.

<Effects Achieved by Foregoing Embodiment>

Exemplary effects achieved by the foregoing embodiment will be described next. These effects in the following description are achieved on the basis of the specific configurations illustrated in the foregoing embodiment. However, these configurations may be replaced by different specific configurations illustrated in this description, as long as comparable effects are achieved by such different specific configurations.

Such replacement may be done across a plurality of embodiments. More specifically, configurations illustrated in different embodiments may be combined to achieve comparable effects.

According to the embodiment described above, the semiconductor device includes the diamond substrate 23 made of diamond, and a nitride semiconductor layer. The nitride semiconductor layer corresponds to at least one of the epitaxial semiconductor layer 2, the epitaxial semiconductor layer 2A, the epitaxial semiconductor layer 2B, the epitaxial semiconductor layer 2C, the epitaxial semiconductor layer 3, the epitaxial semiconductor layer 3A, the epitaxial semiconductor layer 3B, and the epitaxial semiconductor layer 3C, for example. The epitaxial semiconductor layer 2 and the epitaxial semiconductor layer 3 are formed in the recess 17 formed at the upper surface 109 of the diamond substrate 23.

In this configuration, diamond having high heat conductivity is formed to contact not only the lower surface but also the lateral surface of the nitride semiconductor layer. Thus, if the semiconductor device including the nitride semiconductor layer becomes a heat generation source as a result of the formation of an element structure on the upper surface of the nitride semiconductor layer, for example, high heat dissipation performance is provided in a lateral direction in addition to a downward direction of the semiconductor device. This makes it possible to suppress temperature increase in the semiconductor device significantly.

Different structures illustrated in this description other than the foregoing structures are omissible, where appropriate. Namely, the effects described above can be achieved by the provision of at least the foregoing structures.

Even if at least one of the different structures illustrated in this description is added appropriately to the foregoing structures, namely, even if a different one of the structures illustrated in this description and not listed as one of the foregoing structures is added appropriately to the foregoing structures, effects comparable to the foregoing effects are still achieved.

According to the embodiment described above, the epitaxial semiconductor layer 2 and the epitaxial semiconductor layer 3 are formed to be surrounded entirely by the upper surface 109 of the diamond substrate 23 in a plan view. This configuration makes it possible to provide high heat dissipation performance on the entire lateral side of the semiconductor device. This achieves significant suppression of temperature increase in the semiconductor device.

According to the embodiment described above, the upper surface 109 of the diamond substrate 23 and the upper surface 401 of the epitaxial semiconductor layer 3 are located on the same plane. This configuration allows the lateral side of the epitaxial semiconductor layer 2 and the lateral side of the epitaxial semiconductor layer 3 to be covered completely by the diamond substrate 23, making it possible to achieve high heat dissipation performance on the lateral side of the semiconductor device.

According to the embodiment described above, the diamond substrate 23 has electrical insulating properties. In this configuration, the projection 16 of the diamond substrate 23 becomes available for use as an element-to-element isolation region in the semiconductor device. This eliminates a need for a step for forming an element-to-element isolation region additionally to achieve simplification of manufacturing steps.

According to the embodiment described above, the semiconductor device includes an intervention layer formed on the inner wall of the recess 17 of the diamond substrate 23. The intervention layer corresponds to at least one of the adhesion layer or core forming layer 19, the adhesion layer or core forming layer 19A, the adhesion layer or core forming layer 19B, and the adhesion layer or core forming layer 19C. The epitaxial semiconductor layer 2 and the epitaxial semiconductor layer 3 are formed in the recess 17 of the diamond substrate 23 with intervention of the adhesion layer or core forming layer 19. In this configuration, during formation of a diamond layer to cover the epitaxial semiconductor layer 2 and the epitaxial semiconductor layer 3 after formation of these epitaxial semiconductor layers, adhesion of the diamond layer with the epitaxial semiconductor layer 2 and the epitaxial semiconductor layer 3 can be increased. Additionally, during formation of the diamond layer to cover the epitaxial semiconductor layer 2 and the epitaxial semiconductor layer 3 after formation of these epitaxial semiconductor layers, the occurrence of defect or damage can be reduced in the epitaxial semiconductor layer 2 and the epitaxial semiconductor layer 3.

According to the embodiment described above, the intervention layer is a lattice relaxation layer for relaxing lattice mismatch between the freestanding diamond substrate 310 and the nitride semiconductor layer 314. In this configuration, during formation of the nitride semiconductor layer 314 in the recess 313 of the freestanding diamond substrate 310, lattice mismatch is relaxed to achieve formation of the nitride semiconductor layer 314 with little crystal defect.

According to the embodiment described above, the semiconductor device includes an electrode part formed on the upper surface of the epitaxial semiconductor layer 3. The electrode part corresponds to at least one of the drain electrode metal 101, the drain electrode metal 101B, the drain or source electrode metal 102, the drain or source electrode metal 102B, the gate electrode metal 106, and the gate electrode metal 106B. In this configuration, if the semiconductor device becomes a heat generation source as a result of the formation of an element structure on the upper surface of the epitaxial semiconductor layer 3, for example, high heat dissipation performance is provided in a lateral direction in addition to a downward direction of the semiconductor device.

According to the embodiment described above, in the method of manufacturing the semiconductor device, a nitride semiconductor layer is formed on the upper surface of a semiconductor substrate. The semiconductor substrate corresponds to the Si substrate 301, for example. The nitride semiconductor layer corresponds to the GaN layer 302, for example. Then, a surface of the GaN layer 302 and the support substrate 305 are joined to each other. Next, the hard mask 306 is formed on the lower surface of the Si substrate 301. Then, a pattern defining the opening region 307 is formed in the hard mask 306. Then, the Si substrate 301 and the GaN layer 302 corresponding to the opening region 307 are removed to form the groove 308 penetrating the Si substrate 301 and the GaN layer 302. Next, the hard mask 306 and the Si substrate 301 are removed. Then, the diamond layer 309 covering the GaN layer 302 is formed on a surface of the support substrate 305. Then, a surface of the GaN layer 302 and a surface of the diamond layer 309 are disengaged from the support substrate 305.

In this configuration, before implementation of the step of removing the Si substrate 301 entirely, the groove 308 is formed in advance to penetrate the Si substrate 301 and the GaN layer 302. This makes it possible to reduce the occurrence of a crack or a fracture in the GaN layer 302 resulting from stress relief.

Different structures illustrated in this description other than the foregoing structures are omissible, where appropriate. Namely, the effects described above can be achieved by the provision of at least the foregoing structures.

Even if at least one of the different structures illustrated in this description is added appropriately to the foregoing structures, namely, even if a different one of the structures illustrated in this description and not listed as one of the foregoing structures is added appropriately to the foregoing structures, effects comparable to the foregoing effects are still achieved.

Unless there is particular limitation, order in which the foregoing processes are performed is changeable.

According to the embodiment described above, a diamond substrate made of diamond is prepared. The diamond substrate corresponds to the freestanding diamond substrate 310, for example. Then, the hard mask 311 is formed on a surface of the freestanding diamond substrate 310. Then, a pattern defining the opening region 312 is formed in the hard mask 311. Then, the freestanding diamond substrate 310 corresponding to the opening region 312 is removed to form the recess 313. Then, the nitride semiconductor layer 314 is epitaxially grown in the recess 313.

In this configuration, if the freestanding diamond substrate 310 is realized commercially, the semiconductor device relating to the present embodiment can be manufactured commercially in a simple way. If the step of removing the freestanding diamond substrate 310 is realized commercially, the semiconductor device relating to the present embodiment can be manufactured commercially in a simple way.

Different structures illustrated in this description other than the foregoing structures are omissible, where appropriate. Namely, the effects described above can be achieved by the provision of at least the foregoing structures.

Even if at least one of the different structures illustrated in this description is added appropriately to the foregoing structures, namely, even if a different one of the structures illustrated in this description and not listed as one of the foregoing structures is added appropriately to the foregoing structures, effects comparable to the foregoing effects are still achieved.

Unless there is particular limitation, order in which the foregoing processes are performed is changeable.

Modifications of Foregoing Embodiments

In the foregoing embodiment, components may be described from the viewpoint of a material quantity, material, dimension, shape, arrangement relative to each other, or condition for implementation, for example. These are in all aspects illustrative and not restrictive, and the components are not limited to these viewpoints given in this description.

Thus, numerous modifications and equivalents not illustrated are assumed to be included within the technical scope disclosed in this description. These modifications include a modification, addition, or omission of at least one component, and extraction of at least one component from at least one embodiment and combination of the extracted component with a component in a different embodiment, for example.

As long as no contradiction is to occur, a component described in a "singular form" in the foregoing embodiment may include "one or more" such components.

Each component described in the foregoing embodiment is a conceptual unit. The technical scope disclosed in this description covers a case where one component is formed of a plurality of structures, a case where one component corresponds to a part of a certain structure, and a case where a plurality of components is provided in one structure.

Each component described in the foregoing embodiment includes a structure having a different configuration or a different shape, as long as such a structure fulfills the same function.

The explanation given in this description should in all aspects be referred to for all purposes relating to the technique in this description and should never be recognized as a background art.

In the foregoing embodiment, if the name of a material is given without particular designation, for example, this material includes a material such as an alloy containing a different additive, as long as no contradiction is to occur.

EXPLANATION OF REFERENCE SIGNS 2, 2A, 2B, 2C, 3, 3A, 3B, 3C Epitaxial semiconductor layer
16, 16A, 16B, 16C, 16D Projection
17, 17A, 17B, 17C, 313 Recess
19, 19A, 19B, 19C Adhesion layer or core forming layer
21, 21A, 21B, 21C, 24, 24A, 24B, 24C, 28, 28B Joint interface
23, 23A, 23B, 23C Diamond substrate
25, 25B Lower surface
101, 101B Drain electrode metal
102, 102B Drain or source electrode metal
105, 105B Surface protective film
106, 106B Gate electrode metal
107 Source or drain pad electrode metal
108 Drain or source pad electrode metal
109, 109B, 401, 401A, 401B, 401C Upper surface
201 Field-effect transistor
201B Multi-finger HEMT
202, 202B Element-to-element isolation region
301 Si substrate
302 GaN layer
303 GaN-on-Si substrate
305 Support substrate
306, 311 Hard mask
307, 312 Opening region
308 Through groove
309 Diamond layer
310 Freestanding diamond substrate
314 Nitride semiconductor layer

The invention claimed is:

1. A semiconductor device comprising:
a diamond substrate made of diamond;
an intervention layer formed on an inner wall of a recess formed at an upper surface of the diamond substrate, a thickness of the intervention layer being equal to or less than 50 nm; and
a nitride semiconductor layer formed in the recess formed at an upper surface of the diamond substrate with intervention of the intervention layer, wherein
the semiconductor device further comprises at least one of:
(A) the nitride semiconductor layer formed to be surrounded entirely by the upper surface of the diamond substrate in a plan view;
(B) the diamond substrate in which the upper surface of the diamond substrate and an upper surface of the nitride semiconductor layer are located on the same plane; and
(C) the diamond substrate having electrical insulating properties.

2. The semiconductor device according to claim 1, wherein
the intervention layer is a lattice relaxation layer for relaxing lattice mismatch between the diamond substrate and the nitride semiconductor layer.

3. The semiconductor device according to claim 2, further comprising:
an electrode part formed on an upper surface of the nitride semiconductor layer.

4. The semiconductor device according to claim 1, further comprising:
an electrode part formed on an upper surface of the nitride semiconductor layer.

5. The semiconductor device according to claim 1, wherein the intervention layer includes an amorphous material.

6. The semiconductor device according to claim 5, wherein the amorphous material in the intervention layer includes an amorphous Si or amorphous Si nitride.

* * * * *